United States Patent
Kansal et al.

(10) Patent No.: US 6,374,326 B1
(45) Date of Patent: Apr. 16, 2002

(54) MULTIPLE BANK CAM ARCHITECTURE AND METHOD FOR PERFORMING CONCURRENT LOOKUP OPERATIONS

(75) Inventors: Arvind K. Kansal, Cupertino; Mark A. Ross, San Carlos; Sachidanandan Sambandan, Sunnyvale, all of CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/426,574

(22) Filed: Oct. 25, 1999

(51) Int. Cl.[7] ............... G06F 12/00; G11C 15/00; H04L 12/28
(52) U.S. Cl. ............ 711/108; 711/5; 711/168; 365/49; 365/230.03; 370/392
(58) Field of Search ............ 711/108, 5, 168; 365/49, 230.03; 370/392

(56) References Cited

U.S. PATENT DOCUMENTS

| | | | | |
|---|---|---|---|---|
| 3,648,254 A | * | 3/1972 | Beausoleil | 365/49 |
| 4,996,666 A | * | 2/1991 | Duluk, Jr. | 365/49 |
| 5,956,336 A | * | 9/1999 | Loschke et al. | 370/392 |
| 5,978,885 A | * | 11/1999 | Clark, II | 711/108 |
| 6,041,389 A | * | 3/2000 | Rao | 711/108 |
| 6,069,573 A | * | 5/2000 | Clark, II et al. | 711/108 |
| 6,081,440 A | * | 6/2000 | Washburn et al. | 365/49 |

* cited by examiner

Primary Examiner—Glenn Gossage

(57) ABSTRACT

Content-addressable memory (CAM) architectures and methods of use are disclosed for enabling multiple concurrent lookups within a CAM array. One implementation arranges CAM arrays into multiple banks and enables parallel lookups of multiple key strings in multiple CAM banks. For a given input key, simultaneous parallel lookups in a plurality of CAM banks are performed by each bank using a bank key consisting of a subset of the bits of the input key. The multiple bank CAM is instructed to extract one or more distinct subsets of input key bits for use as bank lookup keys. Each bank key is passed to the appropriate bank according to the instruction received. Multiple bank sizes, depending on the key width and overall size of the CAM array, are also possible. Each bank produces a single output result, and each bank is returned to the host device that initially issued the lookup instruction.

10 Claims, 4 Drawing Sheets

MULTIPLE BANK CAM ARCHITECTURE AND METHOD FOR PERFORMING CONCURRENT LOOKUP OPERATIONS

BACKGROUND OF THE INVENTION

1. Field of the Invention

The present invention generally concerns memory devices, in particular content addressable memories (CAMs).

2. Description of the Related Art

Content-addressable memories (CAMs) allow a simultaneous search of all entries by performing a bit-wise comparison of an input value (the key or compared) against every entry at the same time. If a match is found between the key and an entry, the CAM returns the address of the matching entry. This address may be used directly by the function requesting the comparison. More commonly, it may be used as a pointer or an index to a conventional memory array (such as a static random access memory or SRAM) to return another value. In one typical use of CAMs, a router lookup or access control application, the conventional memory contains the action to be taken for a packet whose flow label matches the corresponding CAM entry, such as "forward out port 5, " "permit," or "deny."

Common applications of CAMs in router and communications switching often require a large number of CAM entries. Thus, CAMs rapidly grow to unmanageable depths (i.e., size in terms of number of entries). The power consumed by such CAMs and their cost rapidly become excessive.

Furthermore, the CAM size problem is only exacerbated by the expected shift to Internet Protocol version 6 (IPv6), which uses 128 bit addresses instead of the current 32 bit addresses used by IPv4. This shift requires wider CAMs. For a given size CAM, as the width increases, the depth must correspondingly decrease.

To address these CAM size limitations, current applications use depth-cascaded CAMs, which are sets of CAM devices (i.e., physical parts or components) connected together externally so as to increase the depth (number) of entries to be checked in response to a lookup instruction. Such a configuration increases the CAM space in the depth dimension, but does not address the problem of limited CAM width, i.e., the width or address dimension. These schemes perform lookups in each CAM device in parallel, but the lookup is of the same key in all CAM devices and only a single value is returned for each lookup. In other words, only a single lookup function is performed even though multiple CAMs are employed.

Today's rapidly evolving routing and switching systems, among other applications of CAM technology, need ever faster and more cost-efficient lookup systems. In particular, it is desirous to perform two or more parallel lookup functions (i.e., lookups of different keys or parts of keys) at the same time. Furthermore, it is desirous to do so without expanding the CAM space in either the width or depth dimension or using additional CAM devices.

What is needed is a method of using a CAM or a set of CAMs to perform multiple lookup functions simultaneously from the same key or different keys, thus saving both the costs of CAM devices and lookup time.

SUMMARY

The present invention is a CAM architecture and method of use thereof that enables multiple simultaneous lookup functions within a grouping of content addressable memory arrays, each returning a different result.

The architecture consists of a new arrangement of a well-known CAM array or set of arrays into multiple banks (not necessarily the same size), an expanded size select logic, and a new operating instruction set that allows the parallel use of multiple lookup key strings in multiple banks. For a given input key of n bits, simultaneous parallel lookups in a plurality of CAM banks are performed, each using a bank key consisting of a subset of the bits of the input key, with potentially as many different bank keys as there are banks. Expresses mathematically, each bank key consists of w bits, where $w \leq n$.

In operation, a single lookup key and a "lookup" command are passed to the multiple bank CAM by the usual means well-known in the art. The key consists of many bits. In the present invention, however, the multiple bank CAM is configured to extract one or more distinct subsets of the bits in the input key for use as bank lookup keys. Each bank key comprises some or all of the bits in the input key, e.g., each bank key may be a copy of the input key. There may be any number of bank keys; in one embodiment of the present invention there are two bank keys.

Each bank key is passed to the appropriate bank according to the configuration of the multiple bank CAM. Multiple bank depths as well as widths, depending on the key width and overall size of the CAM array, are possible. All banks perform their respective CAM lookups by means well-known in the art at the same time. Each bank produces one or more output results for each lookup, again by the usual method employed in a CAM. This set of outputs, one or more per bank, is then returned to the host or controlling entity that initially commanded the lookup function.

The architecture of the present invention and its various embodiments thus provide a fast, efficient, cost-saving lookup system readily adaptable for a wide variety of data processing applications, especially including but not limited to communications routing and switching.

BRIEF DESCRIPTION OF THE DRAWINGS

The present disclosure may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
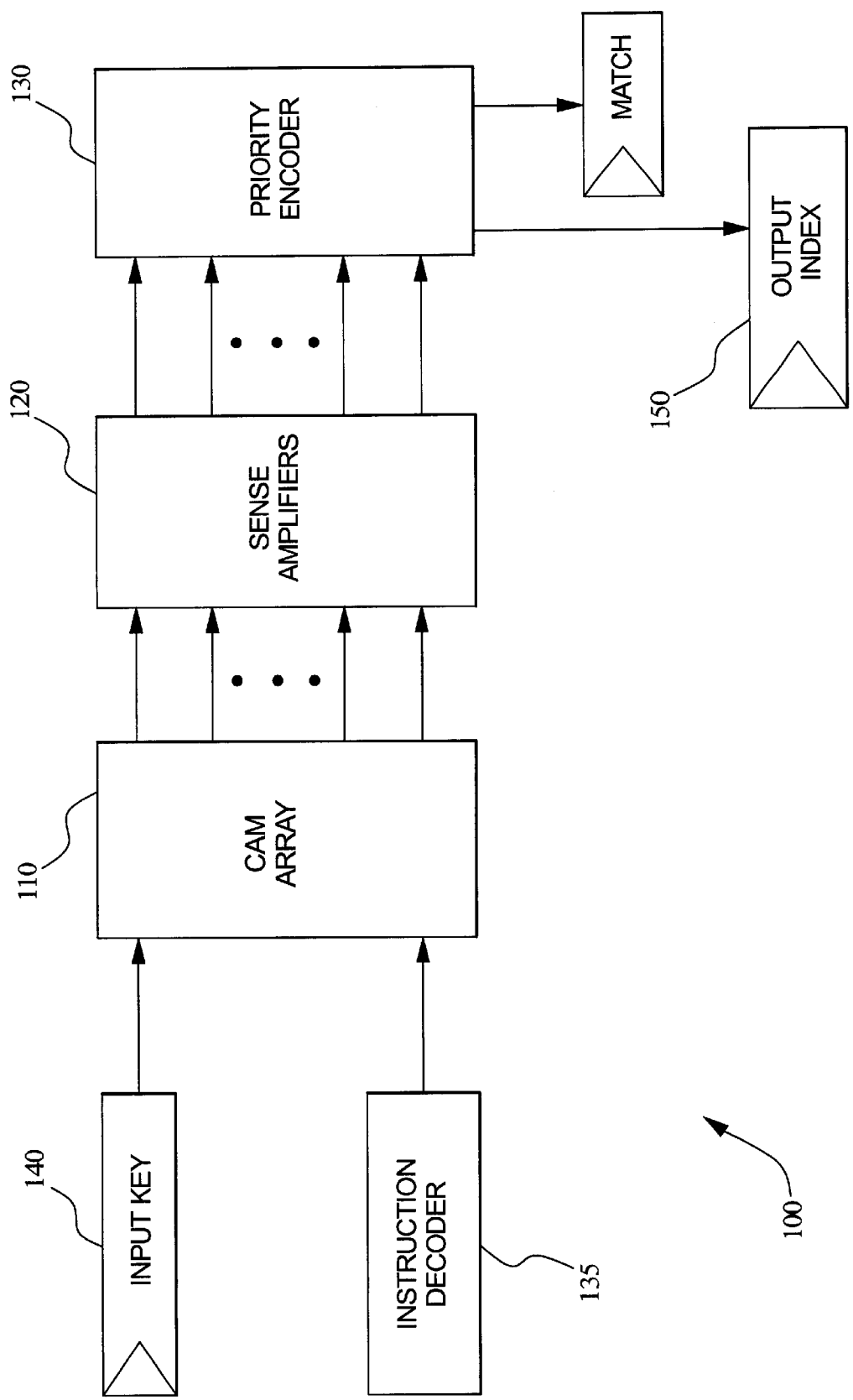
FIG. 1 is a high-level schematic of a prior art CAM.

The prior art CAM 100 is shown in FIG. 1. It uses CAM array 110, sense amplifiers 120, and priority encoder 130 to select among multiple hits if the input key 140 should match more than one entry in CAM array 110. Array 110, sense amplifiers 120, instruction decoder 135 (and associated control elements, not shown) and priority encoder 130 are common components of CAMs known in the art today. The address of the matching entry in the CAM forms the output index 150 of the CAM lookup. This address can be used directly by the host (the system or device that caused the CAM to perform a lookup) or, more commonly, used as an index to another physical device (not shown).

Also known in the art today is the ability to purchase CAM "cores," i.e., the intellectual property defining the functional blocks within the common CAM device, for use in custom-made application specific integrated circuits (ASICs). One skilled in the art can thus specify a CAM array of a particular size, associated sense amplifiers, and other components of the common CAM along with custom control logic and other circuit cores to create an ASIC able to perform as desired.

CAM cores are currently available from a variety of suppliers such as IBM®, Kawasaki LSI™, LSI Logic™, Altera®, and Lucent Technologies®.

The architecture of the present invention allows the integration and use of a number of CAM arrays in a single system such that a single lookup key is used to perform multiple lookups in different banks, thus producing multiple, simultaneously-available lookup results in parallel.

Figure 2:
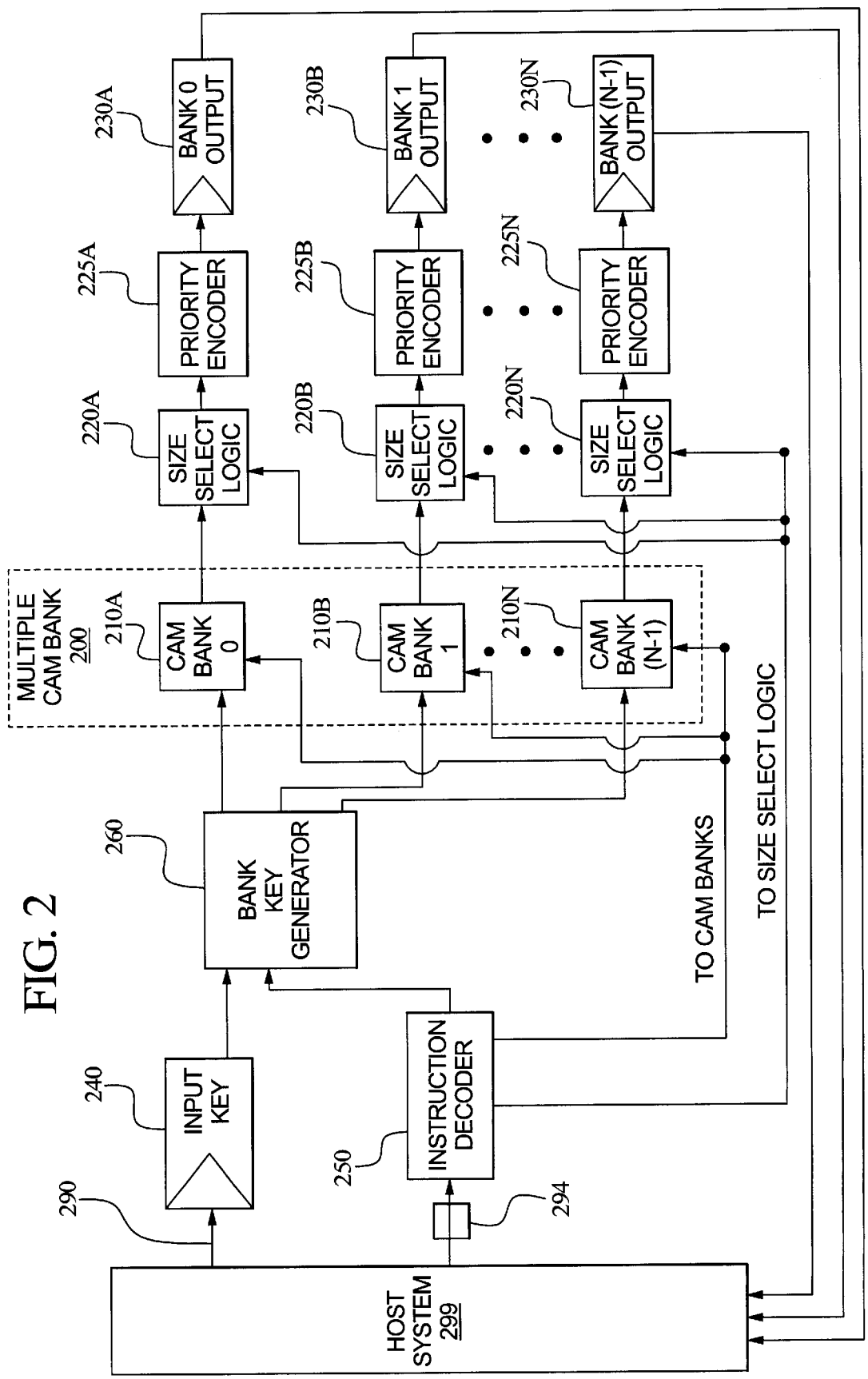
FIG. 2 is a high-level schematic of a multiple bank CAM architecture according to one embodiment of the present invention.

FIG. 2 shows one embodiment of the present invention comprising multiple CAM arrays arranged in banks 210A through 210N, hereinafter referred to as multiple bank CAM 200. Each bank has its own sense amplifier 120 (not shown), and each sense amplifier is connected to its respective size select logic 220A–220N. Each size select logic 220 drives priority encoder 225A–N, respectively, each of which is functionally equivalent to priority encoder 130 of FIG. 1 and well-known in the art. This enables the generation of multiple simultaneous output indices 230A, 230B, . . . , 230N (also referred to as "lookup results") using one or more (potentially different) subsets of input key 240 in multiple bank CAM 200. Subsets of input key 240, comprising but not limited to exclusive and inclusive subsets and including subsets containing all bits of input key 240, are generated in bank key generator 260 in response to the lookup instruction decoded in instruction decoder 250.

Figure 3A:
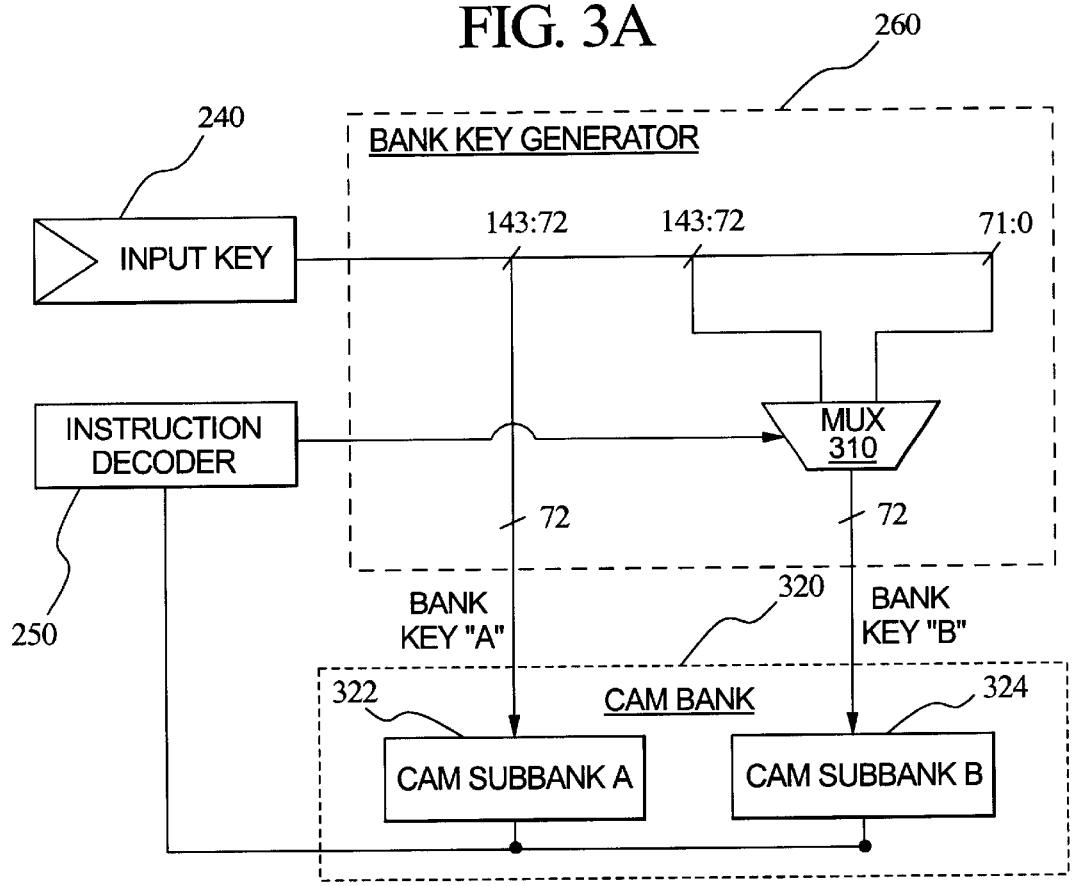
FIG. 3A is a high-level schematic of bank key generator 260, according to one embodiment of the present invention.

Bank key generator 260 may be implemented in any of several means well-known in the art. For example, in one embodiment shown in FIG. 3A, bank key generator 260 is a simple bit-wise divider. High-order bits [143:72] of a 144-bit input key 240 are sent to the "A" sub-bank of CAM bank 320. In this embodiment, a single CAM bank 320 is provided with tow key inputs, one for sub-bank "A" and one for sub-bank "B" (reference designations 322 and 324 in FIG. 3A), which allows the use of multiple key sizes within a single CAM bank 320.

Multiplexor 310 is used to select the sub-bank "B" key from either the low-order bits [71:0] or the high-order bits [143:72]. Thus, when the input applied to CAM sub-banks A and B is the same, sub-bank B is effectively depth-cascaded with sub-bank A. When the A and B keys differ, two parallel lookups using the different keys are run.

Figure 3B:
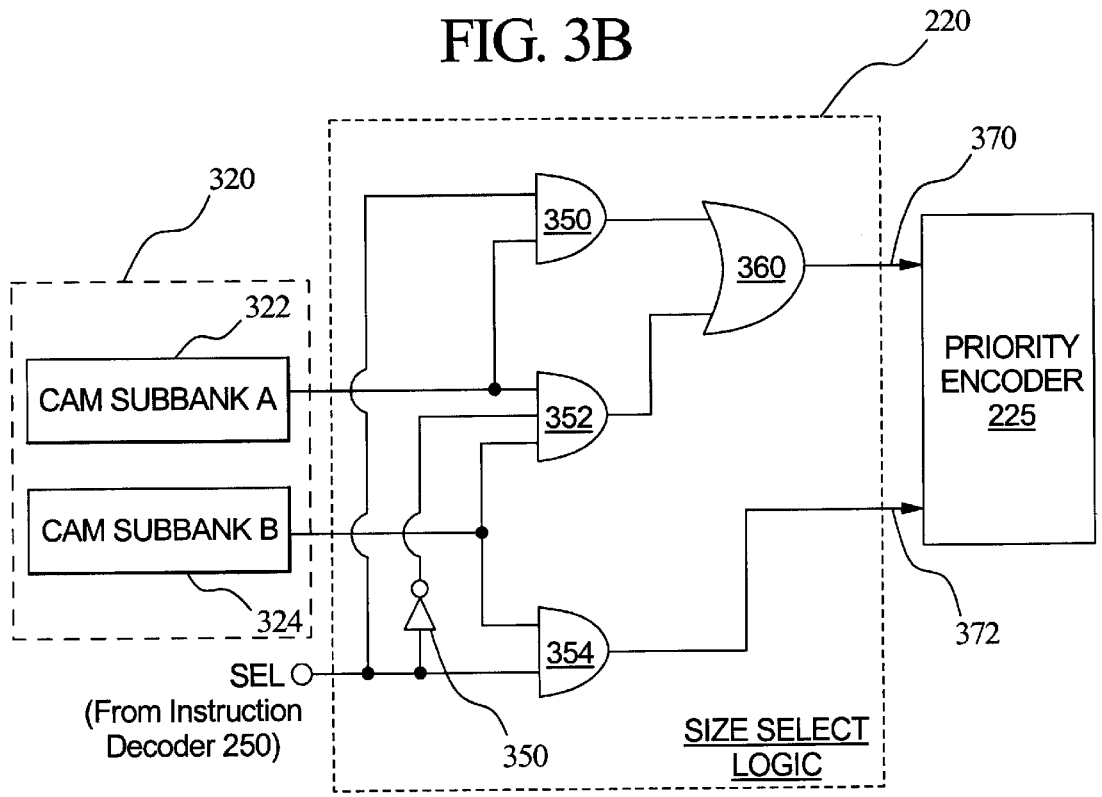
FIG. 3B is a high-level schematic of size select logic 220 according to one embodiment of the present invention.

The output (or outputs, in the case of multiple input key [sub-banked] comparison discussed above) of each CAM bank 210 is (are) each fed into size select logic 220. Each size select logic 220, in one embodiment of the present invention, interprets the outputs of the comparisons in sub-banks 322 and 324 as shown in FIG. 3B. Size select logic 220 determines whether outputs 370 and 372 correspond to each sub-bank 322 and 324 respectively (SEL==1) or reflect the width-cascaded, (combined) sub-bank output (SEL ==0). In the latter, SEL ==0 case, output 372 is always logic 0 while output 370 is a bit-wise AND of the entries in sub-banks 322 and 324.

In some alternate embodiments not using the above sub-bank scheme (and thus applying a single, fixed-length key to each CAM bank 210), only one output is produced from the CAM comparison. Accordingly, size select logic 220 is not required.

In a still further alternate embodiment, the outputs of several banks may be combined in size select logic 220, as by a bit-wise AND function, to produce a single input to a corresponding priority encoder 225. One of ordinary skill will also see that combinations and functions of bank outputs other than a bit-wise AND are equally possible. Accordingly, the function of size select logic 220 is not so limited.

Although a sub-banked configuration using only two, 72-bit sub-banks is discussed, one of ordinary skill in the art will readily appreciate that any number of sub-banks and key lengths may be employed, limited only by the total area (width times depth) and topology of the CAM bank to be configured into sub-banks. As the logical connections and configuration of both bank key generator 260 and size select logic 220 (and the associated control logic in instruction decoder 250) are well within the capabilities of one of ordinary skill, they are not further discussed herein. Accordingly, the present invention is not limited to any particular combination of key size, sub-bank configuration, size select logic, or instruction set.

Configuring multiple bank CAM 200 is accomplished by an instruction from the host system 299 employing the multiple bank CAM, such as a router or switch. Instructions are sent to the CAM through any of a number of means well-known in the art and decoded, again by means well known in the art, by instruction decoder 250, shown in FIG. 2. In one embodiment, the following instructions produce the corresponding bank key and bank configuration for the commanded lookup. In this particular embodiment, the CAM array consists of two 72-bit wide by 32K word deep banks, each capable of being configured into sub-banks. The present invention is, as noted above, in no way limited to CAM arrays of any particular size, width, or depth dimension.

| Inst. # | Instruction Name | Description |
| --- | --- | --- |
| 2 | 72-bit Global Compare | Perform a 72-bit lookup in both Banks 0 and 1, treating the entire device as a single 72b × 64K bank. |
| 3 | 144-bit Global Compare | Perform a 144-bit lookup in both Banks 0 and 1, treating the entire device as a single 144b × 32K bank |
| 8 (when CCR [39] =0) | 72/144-bit Split Compare | Perform a 72-bit lookup in Bank 0 and a 144-bit lookup using two input key words in Bank 1. Bank 1 thus functions as a 144-bit by 16K word deep [144b × 16K] bank. |
| 8 (when CCR [39] =1) | 72/72-bit Split Compare | Perform a 72-bit lookup in Bank 0 and a parallel 72-bit lookup in Bank 1, treating each bank as a separate 72b × 32K bank |
| 9 | 144-bit Dual Bank Compare | Perform a 144-bit lookup in Bank 0 and Bank 1 in parallel as two banks each 144b × 16K |

-continued

| Inst. # | Instruction Name | Description |
|---|---|---|
| 10 | 288-bit Compare | Perform a 288-bit lookup in Bank 0 and Bank 1 as one bank of 288b × 8K |

In the above table, instructions #8 and #9 utilize sub-banking to effect the multi-bank lookup. CAM Control Register (CCR) bit 39, a part of instruction decoder used as an additional instruction bit to provide two variations on instruction #8.

Although a particular set of instructions denoting certain bank key widths and corresponding bank organizations is described, those skilled in the art will realize that bank key widths and bank organizations other than these can be used. Accordingly, the invention is not limited to any particular bank key widths or bank organization.

Furthermore, in another embodiment of the present invention, multiple bank CAM 200 is pre-configured into a set number of banks prior to receiving CAM instructions and the lookup key or keys.

Alternatively, the CAM instruction system (i.e., the host system 299, CAM instruction generator 292, and instruction decoder 250 of FIG. 2) can be configured to include commands or instructions that specify a particular bank key length associated with individual banks and/or lookup commands. For example, an instruction is used to load one or more designated register(s) or memory location(s) with a set of bank key masks, e.g., bits [71:64, 15:0] for Bank 0 and [71:64, 47:32] for Bank 1—a split 24 bit lower/24 bit upper compare. Instruction #6 (for example) is designated the "Variable Multiple Lookup" command, which has the effect of reading the above designated register(s) or memory location(s) to determine which bits of the input key to use in the commanded lookup and to which banks to apply them.

Similar commands are likewise available to configure the CAM banks into any width and depth organization desired for a given lookup. This flexibility permits the user of the device to configure virtually any number of banks (within the physical topology limitation of the CAM arrays) and thus obtain any number of simultaneous, parallel lookup outputs in response to a given lookup instruction. Clearly, however, there must be a logical relationship between the width of the bank keys and the configured bank widths. Bank keys cannot be wider than the corresponding banks. It is, however, possible for bank keys to be narrower (i.e., have fewer bits) than the bank on which they are used to perform a lookup, using global masking bits well known in the CAM art.

Figure 4:
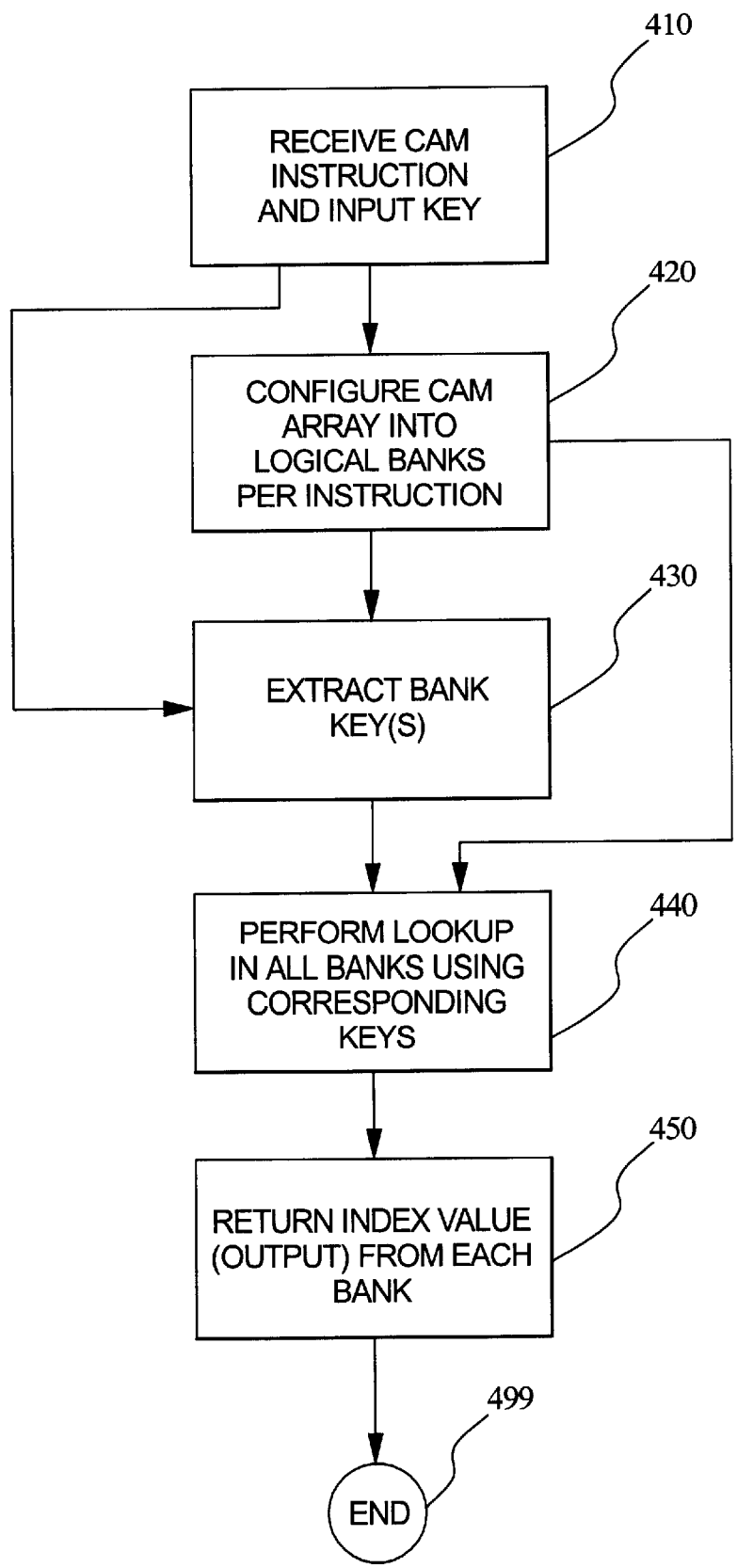
FIG. 4 is a flowchart of a method of employing a multiple bank CAM to perform multiple simultaneous lookup functions, according to one embodiment of the present invention.

The above embodiment is thus practiced, in its most general form, according to the process depicted in FIG. 4. The process begins when the multiple bank CAM receives a CAM instruction 294 (referring to FIG. 2) and an input key 240 from the host system 299 in step 410. This step is performed by any number of conventional means not further described herein. The instruction is decoded, again via conventional means well-known in the art, and the CAM is configured into logical banks as necessary, step 420. As noted above, the CAM may already be in the needed logical bank configuration, or the required bank organization may simply be a combination or sub-combination of the existing banks. The CAM may also be pre-configured so that no additional bank configuration is required. In such cases, step 420 may be omitted or simplified. In a substantially parallel process, shown in step 430, the bank keys are generated from the input key. This step of bank key generation may be performed by any number of means well-known in the art, such as selectively masking certain bits of the input key.

The bank keys are then passed to the appropriate corresponding banks, and each bank performs a lookup of the supplied bank key as commanded, step 440. Finally, in step 450, the corresponding index value (i.e., the address of the matching bank entry for each key) is returned, one or more entries per bank as determined by size select logic 220 and priority encoder 225 of FIG. 2. Lookup instruction processing then terminates at step 499.

Although a content-addressable memory (CAM) is described generically, those skilled in the art will realize that commercially available memories and specifically CAMs include numerous functionally-equivalent variants, such as DRAMs or the ternary CAM (TCAM) device with entry-level masking. Accordingly, the invention is not limited to any particular type of memory device or CAM.

In one alternate embodiment, the present invention may be implemented with TCAM arrays of the type well known in the art. Such arrays, exemplified by the NL82711 module manufactured by NetLogic Microsystems, Inc. of Mountain View, Calif., provide for selectable masking of individual bits in each entry. The mask register is used to control which bits in each entry are used in a lookup, and which bits are treated as "don't care" for purposes of the lookup.

A TCAM allows simple lookups to be implemented efficiently. An example pertaining to router access control processing will illustrate the potential inefficiency of using a conventional (binary) CAM: to permit packets from a particular source address, the CAM must contain an entry containing that source address. However, since the other fields in the lookup key can take on a number of values depending on the entire packet, a conventional CAM needs to have as many CAM entries containing the desired source address as there are possible values for the other fields. This is so that for any value of the other fields, there exists a match to the particular source address.

One method to make such simple lookups (i.e., lookups that do not depend on the rest of the field values) more efficient is to use the TCAM's masking capabilities to set the other fields in some or all of the entries to "don't care." The lookup key is then compared to only those bits or fields in the TCAM entry not masked as "don't care." A given field can thus serve double (or even greater) duty by being used for full width comparisons without masking and for comparisons to subsets of fields with masking.

In another alternate embodiment, additional instruction decoding logic in instruction decoder 250 (referring now to FIG. 2) translates complex instructions into one or more parallel lookup instructions (denoting different bank keys and/or bank organizations) that provide simultaneous parallel lookups using different subsets of input key 240.

Trademark Notice

IBM is a registered trademark of IBM Corporation of White Plains, N.Y.

Kawasaki LSI is a trademark of Kawasaki LSI U.S.A., of San Jose, Calif.

LSI Logic is a trademark of LSI Logic Corp. of Milpitas, Calif.

Altera is a registered trademark of Altera Corp., of San Jose, Calif.

Lucent Technologies is a registered trademark of Lucent Technologies, Inc. of Murray Hill, N.J.

NetLogic Microsystems is a registered trademark of NetLogic Microsystems of Mountain View, Calif.

While particular embodiments of the present invention have been shown and described it will be apparent to those skilled in the art that changes and modifications may be made without departing from this invention in its broader aspect and, therefore, the appended claims are to encompass within their scope all such changes and modifications as fall within the true spirit and scope of this invention.

We claim:

1. A method of performing multiple concurrent lookups, the method comprising:

configuring a plurality of content addressable memory (CAM) banks as a multiple bank CAM having an input key comprising a plurality of bits; and performing a plurality of lookups using all or part of the input key in the multiple bank CAM contemporaneously, each of the plurality of lookups generating a corresponding output;

wherein said configuring includes extracting one or more bank keys, each of the one or more bank keys corresponding to one of the plurality of CAM banks, and each of the one or more bank keys including a subset of the plurality of bits of the input key.

2. The method of claim 1, wherein each subset of the plurality of bits is exclusive of every other subset.

3. The method of claim 1, wherein the one or more bank keys comprise all of the plurality of bits.

4. The method of claim 1, wherein the one or more bank keys are of different lengths.

5. The method of claim 1, further comprising receiving a lookup command;

wherein said configuring is performed in response to said receiving the lookup command.

6. The method of claim 1, further comprising receiving a lookup command;

wherein said configuring is performed in response to said receiving the lookup command but before said performing the plurality of lookups.

7. An apparatus for performing multiple concurrent lookups comprising:

a plurality of content addressable memory (CAM) banks having an input key comprising a plurality of bits; and an instruction decoder, coupled to the plurality of CAM banks, for receiving an instruction and for providing a corresponding bank key to each of the plurality of CAM banks based, at least in part, on the instruction and selections from the plurality of the bits of the input key; and wherein each of the plurality of CAM banks performs a lookup based on its corresponding bank key contemporaneously with each other of the plurality of CAM banks and outputs a corresponding lookup result.

8. The apparatus of claim 7, wherein the plurality of CAM banks form a binary CAM.

9. The apparatus of claim 7, wherein the plurality of CAM banks form a ternary CAM.

10. The apparatus of claim 7, wherein the instruction decoder and the plurality of CAM banks are implemented in a single integrated circuit device.

* * * * *

UNITED STATES PATENT AND TRADEMARK OFFICE
CERTIFICATE OF CORRECTION

PATENT NO. : 6,374,326 B1
DATED : April 16, 2002
INVENTOR(S) : Arvind K. Kansal, Mark A. Ross and Sachidanandan Sambandan It is certified that error appears in the above-identified patent and that said Letters Patent is hereby corrected as shown below:

Column 1,
Line 14, "compared" with -- comparand --

Column 2,
Line 12, replace "Expresses" with -- Expressed --

Column 3,
Line 49, replace "tow" with -- two --

Column 5,
Line 11, after "decoder" insert -- 250, is --

Move text beginning at Column 6, line 56 through Column 7, line 2, to after Column 7, line 9.

Signed and Sealed this

Twenty-seventh Day of August, 2002

*Attest:*

*Attesting Officer*

JAMES E. ROGAN
*Director of the United States Patent and Trademark Office*